United States Patent [19]
Bell

[11] Patent Number: 5,723,823
[45] Date of Patent: Mar. 3, 1998

[54] CIRCUIT BOARD WITH ENHANCED REWORK CONFIGURATION

[75] Inventor: James S. Bell, Austin, Tex.

[73] Assignee: Dell USA, L.P., Austin, Tex.

[21] Appl. No.: 257,402

[22] Filed: Jun. 9, 1994

[51] Int. Cl.$^6$ ............................................. H05K 1/02
[52] U.S. Cl. .................... 174/262; 174/266; 174/250; 361/778
[58] Field of Search ........................... 174/266, 262, 174/250, 261, 260; 361/778, 760, 780, 777

[56] References Cited

U.S. PATENT DOCUMENTS

| | | | |
|---|---|---|---|
| 3,436,819 | 4/1969 | Lunine | 29/628 |
| 3,571,923 | 3/1971 | Shaheen | 29/625 |
| 4,413,309 | 11/1983 | Takahashi et al. | 361/406 |
| 4,560,962 | 12/1985 | Barrow | 333/1 |
| 4,859,806 | 8/1989 | Smith | 174/68.5 |
| 4,942,400 | 7/1990 | Tarzaiski et al. | 341/155 |
| 5,191,174 | 3/1993 | Chang et al. | 174/266 |
| 5,363,280 | 11/1994 | Chobot et al. | 361/794 |

*Primary Examiner*—Laura Thomas
*Attorney, Agent, or Firm*—Haynes and Boone, L.L.P.

[57] ABSTRACT

A rework configuration is provided for disconnecting defective lithography-formed conductors and/or overlying electrical components from the printed circuit wiring netlist and connecting rework elements at the substituted sites. In particular, defective regions can be severed at spaced first and second target areas upon the upper surface of the PCB and one or more interconnect structures can be coupled therebetween. The interconnect structures allow re-routing of PCB conductors, allow connectivity between the upper and lower surfaces, allow connectivity to power and ground planes, and allow pull-up, pull-down and decoupling connectivity.

10 Claims, 2 Drawing Sheets

CIRCUIT BOARD WITH ENHANCED REWORK CONFIGURATION

BACKGROUND OF THE INVENTION

1. Field of the Invention

This invention relates to an interconnect device and more particularly to one or more interconnect devices arranged upon and within a printed circuit board (PCB) to provide an enhanced rework configuration.

2. Background of the Relevant Art

PCBs or printed wiring boards (PWBs) are rigid or flexible single, double or multi-layered boards having printed conductors placed upon or within the board material. A PCB is designed to receive separately manufactured electrical components and to interconnect those components in an overall circuit structure. The components or parts comprise integrated or discreet circuits well-known in the semiconductor art.

PCBs are classified by the number of layers in which they contain, as implied by the terms single-sided, double-sided and multi-layered boards. Multi-layer PCBs may have internal conductors and internal ground or power planes, as well as conductors on both sides. Most industrial and commercial PCBs are manufactured from rigid copper-clad epoxy-impregnated glass fiber or phenolia-impregnated laminate. In a subtractive process, a conductive material such as copper is deposited upon the upper surface of the dielectric laminate. Thereafter, select regions of the exposed copper material are removed by photolithography and etch. A coplanar arrangement of closely spaced, narrow metallic conductors remain, upon which a subsequent dielectric layer may be placed. In a single-sided or double-sided setting, the conductors extend between terminal ends arranged adjacent to overlying electrical components. The leads or wires from adjacent components can be surface mounted or connected at plated-through holes at the terminal ends of each conductor. In a multi-layer setting, terminal ends of conductors connect at vias which extend from the buried conductor plane to a surface layer. From the surface layer, each via can be connected to an overlying electrical component, either directly or through a lithography-formed conductor extending across the surface layer.

Each conductor within a single-sided, double-sided or multi-layered PCB is fabricated from "artwork" generated by a circuit designer. In order to produce the artwork or layout of component parts and conductors across a PCB, the designer must first compile a listing of electrical components and component drawings. Next, he or she assembles an outline of each component upon a PCB area and arranges interconnect at pin locations near the periphery of each component. From the component arrangement and interconnect configuration, the designer produces a geometric netlist which can be digitized and provided in computer media. The digitized layout is then converted to artwork format and presented to a photomaster for photo tooling. The photomaster operates similar to a mask in photolithography and is used to pattern the conductors upon the upper surface of a fabricated or to-be-fabricated PCB.

From the above, it is appreciated that generation of artwork requires a considerable amount of forethought and effort in order to ensure that, when reduced to a custom-wired PCB, the PCB will perform according to its netlist requirements. If the netlist is determined to be defective or if modification is needed after artwork and custom layers are formed, then an entirely new netlist, including artwork and custom layers must be derived. Even if the modification is slight, an entirely new artwork must oftentimes be generated. If the designer wishes not to produce new artwork and a new custom-wired PCB, he or she may manually separate defective conductors upon the surface layer and attach partially insulated fly-wires across the defective conductor.

If only slight modifications are needed, re-layout using entirely new artwork should be avoided. However, manual separation and placement of fly-wires is both time consuming and can be adverse to proper electrical performance. Long fly-wires, even if mostly insulated, emit substantial radiation and incorporate resulting noise into the PCB circuit. It is therefore desirable that rework of a PCB not entail re-generation of artwork and subsequent fabrication, and it is further desirable that if fly-wires are used, the wires be as short as possible and that rework conductors lie primarily within the PCB (i.e., buried between the opposing surfaces). It is further advantageous that the rework conductors be probe tested at the back-side surface of the PCB at select locations in order to take advantage of conventional bed-of-nail probe testers.

What appears to be a common trait in many rework situations is the failure of the circuit designer to properly couple potential (i.e., power or ground) signals at one or more locations within the PCB. Rather than re-generating artwork or making high-resistance, long fly-wire connection to the desired circuit node from a potential voltage source, it would be desirable to have potential voltages available as near to the rework conductors as possible. It would be further desirable to have the capability of connecting the potential voltages to the rework conductors on the surface layer, and to connect pull-up/pull-down resisters or decoupling capacitors therebetween.

SUMMARY OF THE INVENTION

The problems outlined above are in large part solved by the rework configuration of the present invention. That is, the rework configuration hereof utilizes at least one interconnect structure arranged within a PCB. Instead of connecting a lengthy fly-wire across a defective, pre-fabricated circuit (i.e., conductor, conductors or electrical components), a short fly-wire can be coupled to a closely spaced interconnect structure connected through buried conductors to another interconnect structure arranged adjacent to and wire-coupled to the other end of the defective circuit. Thus, the defective circuit can be routed around or bypassed using a buried conductor arranged between interconnect structures.

The interconnect structures can, for example, be regularly placed across the PCBs in a pattern which provides close proximity of one interconnect structure to one target area and another interconnect structure to the other target area. By connecting target areas through the buried-connected interconnect structures, the defective circuit arranged between the target areas can be bypassed with short, conveniently placed fly-wires. Of further importance is the arrangement of interconnect structures having test pads connected to terminal ends of each rework conductor. The test pads are thereby arranged in a pre-defined area suitable for testing with probes from a bed-of-nail tester.

Each interconnect device not only includes a plated hole for receiving one end of a fly-wire, but also includes an interconnect bonding pad spaced from at least one potential bonding pad. The interconnect bonding pad is connected at terminal ends of the rework conductors or signal lines buried within the PCB. The interconnect bonding pad is connected to the plated hole and is adapted to receive, if desired, one end of an electrical component, the other end being coupled to the potential bonding pad. Thus, pull-up, pull-down and/or decoupling components can be readily bonded at each interconnect structure within the rework configuration.

Broadly speaking, the present invention contemplates a rework configuration for routing between spaced first and second target areas arranged upon a PCB. The rework configuration comprises a printed circuit board having a plurality of coplanar conductors spaced between an upper planar surface and an opposing lower planar surface. A plurality of interconnect structures is further provided across the printed circuit board and electrically connected to each other by at least one of the conductors. A first wire is connected at the upper planar surface between a first target area and one of the plurality of interconnect structures. A second wire is connected at the upper planar surface between a second target area and another of the plurality of the interconnect structures.

Each of the plurality of the interconnect structures comprises a plated hole extending entirely between the upper and lower planar surfaces. The planar hole is adapted to receive a wire at the upper surface and a test probe at the lower surface. Further, each of the plurality of interconnect structures comprises at least one signal via extending from the upper surface to one of the plurality of conductors, and an interconnect bonding pad arranged upon the upper surface between the signal via and the plated hole. The interconnect bonding pad is further adapted to electrically receive an electrical component coupled between the interconnect bonding pad and a ground bonding pad. Alternatively, or in addition to, said interconnect bonding pad is further adapted to electrically receive an electrical component coupled between the interconnect bonding pad and a power bonding pad.

The present invention further contemplates an interconnect structure. The interconnect structure comprises an interconnect bonding pad arranged upon an upper surface of an insulative structure, and a plated hole extending entirely between the upper surface and a lower surface of the insulative structure. The plated hole is connected upon the upper surface to the interconnect bonding pad, and the plated hole is further connected upon the lower surface to a test pad. A signal via extends from the upper surface to one of a plurality of conductors buried within the insulative structure. The signal via is connected upon the upper surface to the interconnect bonding pad. A potential bonding pad is arranged upon the upper surface and spaced from the interconnect bonding pad, wherein a potential via extends between the upper surface and a potential conductor buried within the insulative structure. The potential bonding pad is connected upon the upper surface to the potential via.

The present invention still further contemplates a method for forming a conductive path between distally spaced first and second target areas upon a printed circuit board, coupling electrical components to the conductive path and testing the conductive path. The method comprises the steps of coupling a first wire from a first target area upon a printed circuit board to a plated hole within a first interconnect structure configured proximate to the first target location. Next, a second wire is coupled from a plated hole within a second interconnect structure to a target area, wherein the first and second interconnect structures are electrically connected by conductors buried within the printed circuit board. Thereafter, opposing ends of an electrical component are bonded between the plated hole and a potential pad provided within each of the first and second interconnect structures. A test pad connected to the plated hole on a planar surface configured opposite the first and second interconnect structures can then be electrically contacted by, for example, a bed-up-nail probe tester.

BRIEF DESCRIPTION OF THE DRAWINGS

Other objects and advantages of the invention will become apparent upon reading the following detailed description and upon reference to the accompanying drawings in which.

Figure 1:
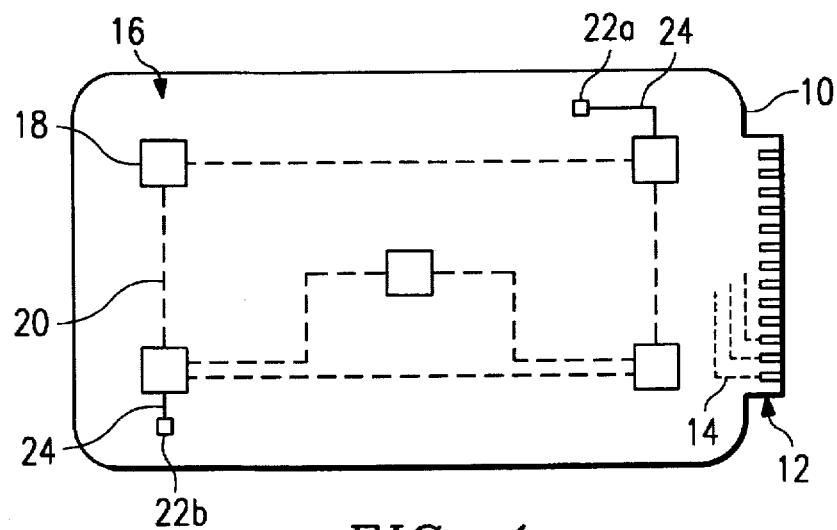
FIG. 1 is a top plan view of a PCB embodying an enhanced rework configuration including a plurality of interconnect structures according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a top plan view of a PCB 10 is shown. PCB 10 includes at least one row of conductive edge connectors 12 arranged on one or both sides of PCB 10. Edge connectors 12 can be frictionally engaged with various female receptors arranged within, for example, a back plane assembly or interconnect cable of common design. Edge connectors 12 comprise the terminal ends of a plurality of lithography-formed conductors 14 which extend across PCB 10.

Conductors 14 can be arranged on one side, both sides or within a plane or layer buried within a multilayer PCB. A suitable arrangement of conductors 14 is their placement within PCB 10 between insulative material extending across the entire surface of PCB 10. It is recognized, therefore, that PCB 10 can be a multilayer board. PCB 10 includes a rework configuration 16 arranged in inactive areas across the PCB substrate. "Inactive areas" is defined as areas which do not contain lithography-formed conductors 14, either upon the outside surface or buried within PCB 10. There may be numerous inactive areas which can accommodate rework configuration 16.

Depending upon the size of inactive regions within PCB 10, rework configuration 16 includes at least two interconnect structures 18 and buried signal lines 20 connected therebetween. A dense pattern of interconnect structures 18 provides a greater likelihood that at least two interconnect structures will be configured near a pair of target areas 22a and 22b.

Target areas are defined herein as upper surface terminal ends of lithography-formed conductors 14. Terminal ends of conductors 14 can be severed and thereby prevented from routing to defective pre-fabricated conductors 14 and/or electrical components attached therebetween. To perform rework around the defective conductors or electrical components, the defective regions are severed and the rework configuration 16 or a portion thereof is connected at the severed points upon target areas 22a and 22b. Connection to rework configuration 16 is performed by wire bonding a fly-wire 24 to upper surface bond sites available at each target area and each interconnect Structure 18.

Figure 2:
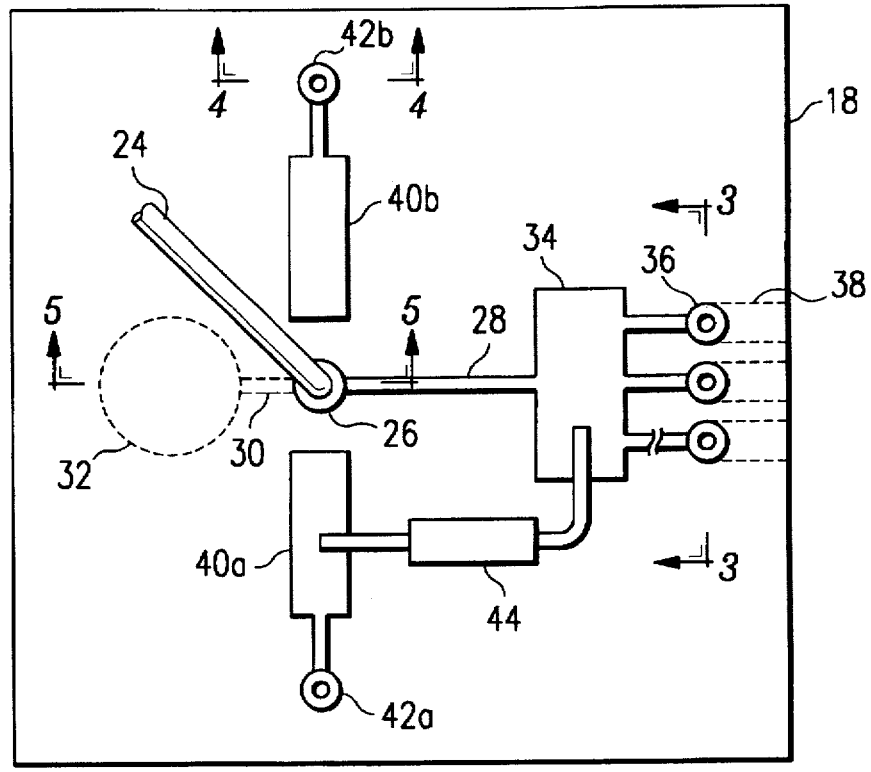
FIG. 2 is a detailed top plan view of an interconnect structure according to the present invention.

Referring now to FIG. 2, a detailed top plan view of interconnect structure 18 is shown. Interconnect structure 18 includes a plated hole 26. Plated hole 26 extends entirely through PCB 10 and between an upper trace element 28 and a lower trace element 30 (shown in phantom). Lower trace element 30 connects to a test pad formed on the lower surface of PCB 10. Formed on the upper surface of PCB 10 and connected to upper trace element 28 is an interconnect bonding pad 34. FIG. 2 illustrates one end of fly-wire 24 extending into plated hole 26. Plated hole 26 therefore has an inner diameter slightly larger than the outer diameter of fly-wire 24 to allow insertion of fly-wire 24 and, when heated, solder fixation of fly-wire 24 within plated hole 26. Plated hole 26 is formed according to plated-throughhole techniques, wherein layers of copper-clad laminate are first etched with signal lines or potential conductor patterns. The layers are then laminated together with dielectric adhesive under heat and pressure with either a layer of unetched copper laminate or copper foil on the external surfaces. The composite structure is then drilled, plated, and etched to form the plating across the entire exposed passageway of the hole.

Once fly-wire 24 is fixed in electrical contact with plated hole 26, signals sent across fly-wire 24 are transmitted to and from test pad 32 as well as interconnect bonding pad 34. The signal can be tested by a probe arranged within a bed-of-nail test apparatus aligned with test pad 32. The probe can make electrical contact with pad 32 to determine the integrity of the reroute signal.

Signal vias 36 extend from the upper surface layer to an intermediate layer between the upper surface and the lower surface for connecting bonding pad 34 with a buried conductor 38. Buried conductor 38 preferably extends coplanar with other buried conductors arranged between interconnect structures 18. Buried conductors 38 can therefore be arranged on the same plane as that which embodies coplanar lithography-formed conductors 14 or upon a plane separate therefrom. In instances where routing space is available, buried conductors 38 can share the same plane and are thereby coplanar with and spaced from lithography-formed conductors 14. Re-routing is achieved by interconnecting fly-wire 24 to one or more signal vias 36.

Spaced a distance from interconnect bonding pad 34 and within the confines of interconnect structure 18 is at least one, and preferably two potential bonding pads 40a and 40b. Bonding pads 40a and 40b are each connected to a potential via 42a and 42b, respectively. Potential vias 42a and 42b, similar to signal vias 36, extend from the upper surface layer to a buried layer within PCB 10. The buried layer is a potential plane or potential conductor spaced from the plane or planes along which conductors 14 and conductors 38 exist. According to one exemplary embodiment, potential bonding pad 40b can be connected to a ground potential through potential via 42b. Thus, a ground plane may exist within PCB 10 and resides at one end of ground via 42b. Similarly, potential bonding pad 40a can be connected to a power potential exceeding ground potential, and is connected to a power plane through power via 42a. Thusly, two separate potential planes can exist within PCB 10 and can connect to separately placed potential bonding pads 40a and 40b.

An important advantage of interconnect structure 18 is the routeability of a conductor on the upper surface to the lower surface through plated hole 26. Additionally, interconnect structure 18 is configured to allow routeability of the most common rework configuration. Namely, custom PCBs often suffer from the circuit designer's failure to connect power or ground potentials at certain nodes. Rather than having to re-layout the PCB to add the power and ground connection as well as, if necessary, pull-up, pull-down or de-coupling, interconnect structure 18 readily provides that capability. In particular, structure 18 includes potential bonding pads 40a and 40b spaced in close proximity to interconnect bonding pad 34. If power or ground connection is needed at a target area 22a, then wire 24 can be routed to the target area and another wire can be connected between one potential bonding pad 40a or 40b and interconnect bonding pad 34. Connection of power or ground to a target area thereby requires only one interconnect structure 18 and two fly-wires, one fly-wire extending to the target area and the other fly-wire extending between the potential bonding pad and the interconnect bonding pad.

Interconnect structure 18 not only allows for connection of a potential voltage (either ground or power) to interconnect bonding pad 34, but can also connect the potential value through a pull-up resistor, pull-down resistor, de-coupling capacitor, etc. Interconnect structure 18 can therefore accommodate an electrical component 44 bonded between pads 40a and 34 and/or pads 40b and 34.

Figure 3:
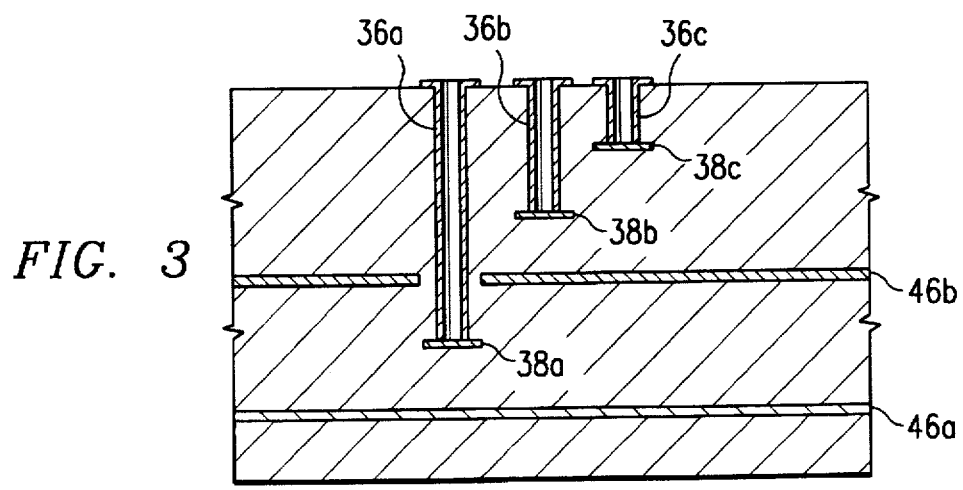
FIG. 3 is a cross-sectional view along plane 3—3 of FIG. 2.

Referring now to FIG. 3, a cross-sectional view along plane 3—3 of FIG. 2 is shown. Specifically, each interconnect bonding pad 34 can be connected to more than one signal via 36. According to one exemplary embodiment, three signal vias 36a, 36b and 36c are shown connected to respective buried conductors 38a, 38b and 38c. Buried conductors 38a, 38b and 38c are shown on dissimilar planes from each other, but it is understood that if space is available, all buried conductors 38a, 38b and 38c can be placed on the same plane and, in some instances, can be placed on the same plane as lithography-formed conductors 14.

Figure 4:
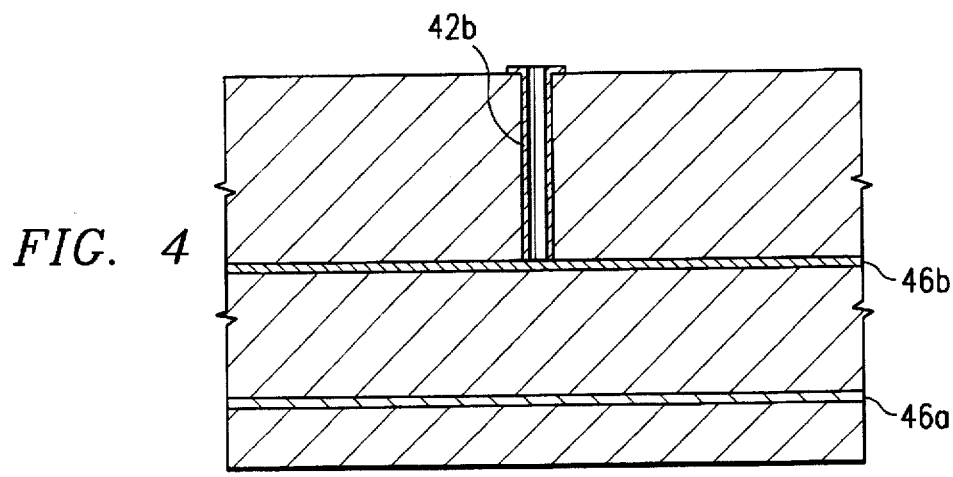
FIG. 4 is a cross-sectional view along plane 4—4 of FIG. 2.

Referring to FIGS. 3 and 4, potential conductors 46a and 46b are shown on dissimilar planes and, in the embodiment illustrated, are configured as an entire planar structure extending across PCB 10. Potential conductors 46a and 46b are connected to a potential source at edge connectors 12 to provide ground and power potentials at respective conductors 46b and 46a. FIG. 4 illustrates ground potential conductor 46b connected to via 42b to present ground potential upon potential bonding pad 40b. While not shown, potential conductor 46a, carrying power potential, can be connected to potential via 42a to provide power potential at potential bonding pad 40a.

Figure 5:
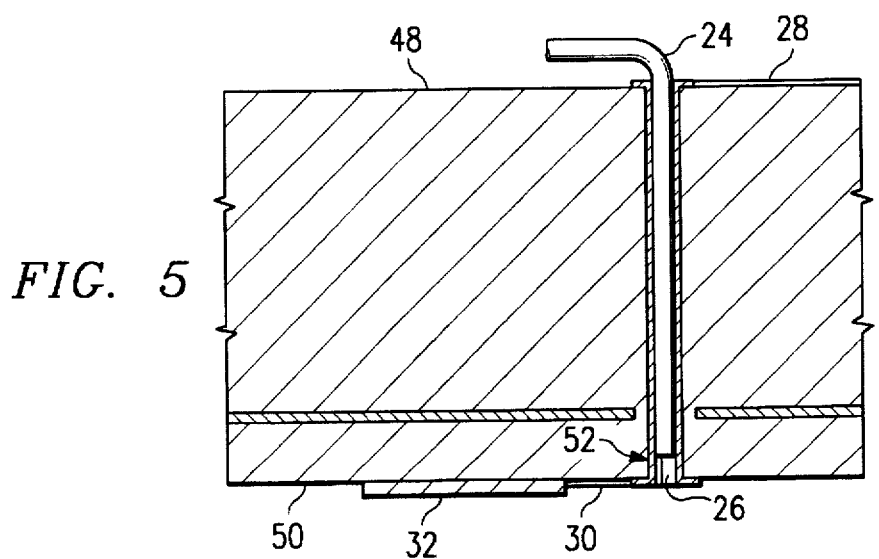
FIG. 5 is a cross-sectional view along plane 5—5 of FIG. 2.

Referring to FIG. 5, plated hole 26 extends entirely through the composite insulative/conductive layers of PCB 10. At the upper planar surface 48, and connected to the plated material surrounding plated hole 26, is upper trace element 28. At the lower planar surface 50 and connected to the plated material around plated hole 26 are lower trace element 30 and test pad 32. The distal end 52 of wire 24 can slideably extend a sufficient distance within plated hole 26 that, when soldered, remains within hole 26 and makes conductive contact with upper and lower trace elements 28 and 30, respectively.

It will be appreciated to those skilled in the art having the benefit of this disclosure that this invention is capable of applications with numerous types of PCBs and with numerous types of overlying electrical components. Furthermore, it is to be understood that the form of the invention shown and described is to be taken as exemplary presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A rework configuration for routing between spaced first and second target areas arranged upon a printed circuit board, comprising:

a printed circuit board having a plurality of coplanar conductors spaced between an upper planar surface and an opposing lower planar surface;

a plurality of interconnect structures spaced across said printed circuit board and electrically connected to each other by at least one of said conductors each of said interconnect structures comprising:

a plated hole extending entirely between the upper and lower planar surfaces, wherein said plated hole is configured to receive a wire at the upper surface and a test probe at the lower surface;

at least one signal via extending from the upper surface to one of said plurality of conductors;

an interconnect bonding pad arranged upon the upper surface between said signal via and a wire;

a ground bonding pad arranged upon the upper surface; and a power bonding pad arranged upon the upper surface; and a first wire connected at the upper planar surface between a first target area and one of said plurality of interconnect structures, and a second wire connected at the upper planar surface between a second target area and another of said plurality of interconnect structures.

2. The rework configuration as recited in claim 1, wherein said interconnect bonding pad is further adapted to electrically receive an electrical component coupled between said interconnect bonding pad and said ground bonding pad.

3. The rework configuration as recited in claim 1, wherein said ground bonding pad is coupled to a ground via extending from the upper surface to a ground conductor arranged within said printed circuit board.

4. The rework configuration as recited in claim 3, wherein said interconnect bonding pad is further adapted to electrically receive an electrical component coupled between said interconnect bonding pad and said power bonding pad.

5. The rework configuration as recited in claim 1, wherein said power bonding pad is coupled to a ground via extending from the upper structure to a ground conductor arranged within said printed circuit board.

6. An interconnect structure for routing between spaced first and second target areas arranged on an insulative structure, comprising:

an interconnect bonding pad arranged upon an upper surface of said insulative structure;

a plated hole extending entirely between the upper surface and a lower surface of said insulative structure, said plated hole being connected upon the upper surface to said interconnect bonding pad and said plated hole being further connected upon the lower surface to a test pad;

a signal via extending from the upper surface to one of a plurality of conductors buried within said insulative structure, said signal via being connected upon the upper surface to said interconnect bonding pad;

a potential bonding pad arranged upon the upper surface and spaced from said interconnect bonding pad; and a potential via extending between the upper surface and a potential conductor buffed within said insulative structure, said potential via being connected upon the upper surface to said potential bonding pad.

7. The interconnect structure as recited in claim 6, wherein said plated hole comprises a conductive inner diameter dimensioned to receive a wire.

8. The interconnect structure as recited in claim 6, wherein said interconnect bonding pad and said potential bonding pad comprise upper surfaces adapted to receive a respective pair of leads extending from an electrical component and, upon application of heat, further adapted to secure said leads upon said interconnect and potential bonding pads.

9. The interconnect structure as recited in claim 6, wherein said potential bonding pad is coupled through said potential via to a ground potential.

10. The interconnect structure as recited in claim 6, wherein said potential bonding pad is coupled through said potential via to a voltage potential exceeding a ground potential.

* * * * *